United States Patent
Chow et al.

(10) Patent No.: US 11,637,076 B2
(45) Date of Patent: Apr. 25, 2023

(54) ELECTRICALLY ISOLATED GATE CONTACT IN FINFET TECHNOLOGY FOR CAMOUFLAGING INTEGRATED CIRCUITS FROM REVERSE ENGINEERING

(71) Applicant: Rambus Inc., San Jose, CA (US)

(72) Inventors: Lap Wai Chow, South Pasadena, CA (US); Bryan J. Wang, South Lake Tahoe, CA (US); James P. Baukus, Westlake Village, CA (US); Ronald P. Cocchi, Huntington Beach, CA (US)

(73) Assignee: RAMBUS INC., San Jose, CA (US)

( * ) Notice: Subject to any disclaimer, the term of this patent is extended or adjusted under 35 U.S.C. 154(b) by 7 days.

(21) Appl. No.: 17/157,567

(22) Filed: Jan. 25, 2021

(65) Prior Publication Data

US 2021/0249363 A1 Aug. 12, 2021

Related U.S. Application Data

(60) Provisional application No. 62/966,857, filed on Jan. 28, 2020.

(51) Int. Cl.
| | |
|---|---|
| *H01L 23/00* | (2006.01) |
| *H01L 29/417* | (2006.01) |
| *H01L 29/423* | (2006.01) |
| *H01L 29/66* | (2006.01) |

(52) U.S. Cl.
CPC ...... *H01L 23/573* (2013.01); *H01L 29/41791* (2013.01); *H01L 29/4236* (2013.01); *H01L 29/4238* (2013.01); *H01L 29/66795* (2013.01)

(58) Field of Classification Search
CPC ......... H01L 29/41791; H01L 29/66795; H01L 27/0924; H01L 29/665; H01L 2924/1433
See application file for complete search history.

(56) References Cited

U.S. PATENT DOCUMENTS 9,985,109 B2 * 5/2018 Alptekin ........... H01L 29/66795
2016/0365424 A1 * 12/2016 Basker ................. H01L 29/665

\* cited by examiner

*Primary Examiner* — Fernando L Toledo
*Assistant Examiner* — Valerie N Newton
(74) *Attorney, Agent, or Firm* — Gates & Cooper LLP

(57) ABSTRACT

A system and method for adding a source contact, a drain contact, and an apparent gate contact to a FinFET having a fin including a source region, a drain region, and a gate disposed over the fin forming one or more transistor junctions with the fin. The method comprises producing a source contact opening extending downward to a first region electrically coupled to the source region, a drain contact opening extending downward to a second region electrically coupled to the drain region, and a gate contact opening extending downward to a third region electrically isolated from the gate, and filling the source contact opening, the drain contact opening, and the gate contact opening with a conductive metal.

19 Claims, 12 Drawing Sheets

100

ELECTRICALLY ISOLATED GATE CONTACT IN FINFET TECHNOLOGY FOR CAMOUFLAGING INTEGRATED CIRCUITS FROM REVERSE ENGINEERING

CROSS-REFERENCE TO RELATED APPLICATIONS

This application claims benefit of U.S. Provisional Patent Application No. 62/966,857, entitled "AN ELECTRICALLY ISOLATED GATE CONTACT IN FINFET TECHNOLOGY FOR CAMOUFLAGING INTEGRATED CIRCUITS FROM REVERSE ENGINEERING," by Lap Wai Chow, Bryan J. Wang, James P. Baukus, and Ronald P. Cocchi, filed Jan. 28, 2020, which application is hereby incorporated by reference herein.

BACKGROUND

1. Field

The present disclosure relates to systems and methods for camouflaging circuits and circuit elements, and in particular to a system and method for camouflaging fin field effect transistors (FinFETs).

2. Description of the Related Art

The desire to protect hardware and associated intellectual property from reverse engineering and cloning has long been present. A conventional integrated circuit is susceptible to reverse engineering (RE) using a variety of techniques that analyze the manufactured silicon die and extract a functional circuit model. Once the functional circuit model is extracted, a counterfeit device can be produced that performs the same function as the original circuit, or a function that is intentionally altered with a Trojan circuit. Alternately, a digital circuit may then be emulated by an off-the-shelf microprocessor or Field Programmable Gate Array (FPGA).

Camouflage techniques have been used to protect logic cells in Application Specific Integrated Circuits (ASICs) against reverse engineering attacks. For example, U.S. Pat. Nos. 6,791,191, 6,774,413, 6,893,916, 7,294,935 and 8,168,487 describe different techniques to make two isolated terminals in a planar CMOS Integrated Circuit look like they are connected. Since these structures are very difficult to differentiate from normal connection structures, when such techniques are applied in the building of camouflage cell libraries, an ASIC designed with such a camouflage library will be protected against reverse engineering.

With the latest developments in FinFET technology, the bulk FinFET has replaced the conventional planar bulk CMOS and has become the state-of-the-art semiconductor fabrication process for feature sizes of 22 nm and smaller. What is needed is a system and method for defining, fabricating, and using FinFETs camouflaged to disguise whether circuits are functionally connected to FinFET terminals. The methods and systems described herein satisfy that need.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

To address the requirements described above, this document discloses a system and method for adding a source contact, a drain contact, and an apparent gate contact to a FinFET having a fin including a source region, a drain region, and a gate disposed over the fin forming one or more transistor junctions with the fin. The method comprises producing a source contact opening extending downward to a first region electrically coupled to the source region, a drain contact opening extending downward to a second region electrically coupled to the drain region, and a gate contact opening extending downward to a third region electrically isolated from the gate, and filling the source contact opening, the drain contact opening, and the gate contact opening with a conductive metal. Another embodiment is evidenced by an ASIC produced by performing the foregoing method.

A further embodiment is evidenced by a camouflaged application specific integrated circuit (ASIC) comprising a plurality of interconnected function logic cells that together perform one or more ASIC logical functions, the plurality of interconnected logic cells. The ASIC comprises a least one camouflaged FinFET, comprising a fin, having a source region and a drain region. The ASIC also comprises a gate, substantially perpendicular to the fin, the gate forming one or more transistor junctions with the fin, a source contact disposed in a source contact opening extending downward to a first region electrically coupled to the source region, a drain contact disposed in a drain contact opening extending downward to a second region electrically coupled to the drain region, and a gate contact disposed in a gate contact opening extending downward to a third region electrically isolated from the gate.

The features, functions, and advantages that have been discussed can be achieved independently in various embodiments of the present invention or may be combined in yet other embodiments, further details of which can be seen with reference to the following description and drawings.

BRIEF DESCRIPTION OF THE DRAWINGS

Referring now to the drawings in which like reference numbers represent corresponding parts throughout.

DESCRIPTION

In the following description, reference is made to the accompanying drawings which form a part hereof, and which is shown, by way of illustration, several embodiments. It is understood that other embodiments may be utilized and structural changes may be made without departing from the scope of the present disclosure.

Overview

This invention describes a way of building a special contact to the gate terminal of a FinFET that looks like a normal gate connection but in actuality is isolated electrically. This special contact can be used in the design of the camouflage logic standard cells in FinFET technology. A digital ASIC designed with a camouflage standard logic cell library implemented with this technique together with other camouflage techniques is highly resistant to reverse engineering attack.

Technology

Figure 1A:
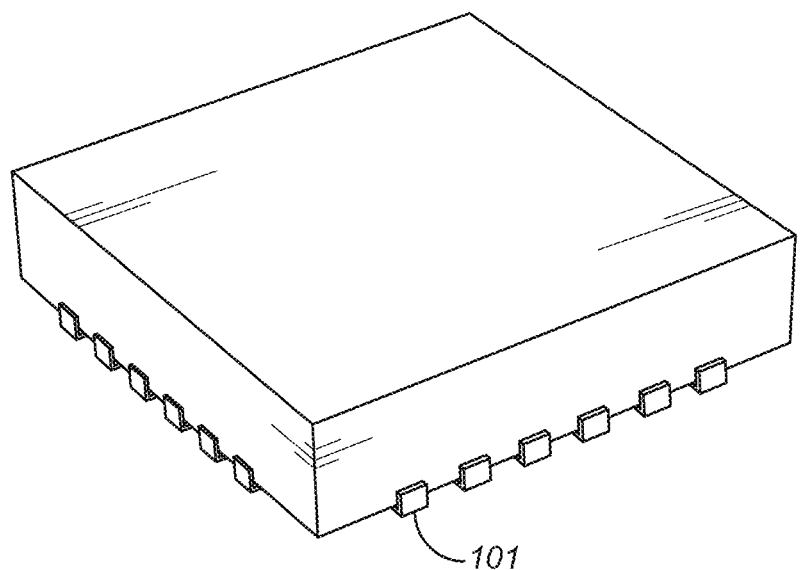
FIG. 1A is a diagram of an integrated circuit such as an application specific integrated circuit.

FIG. 1A is a diagram of an integrated circuit such as an application specific integrated circuit (ASIC) 100. The ASIC 100 comprises a plurality of pins 101, which together provide power and input signals to the ASIC and also provide output signals.

Figure 1B:
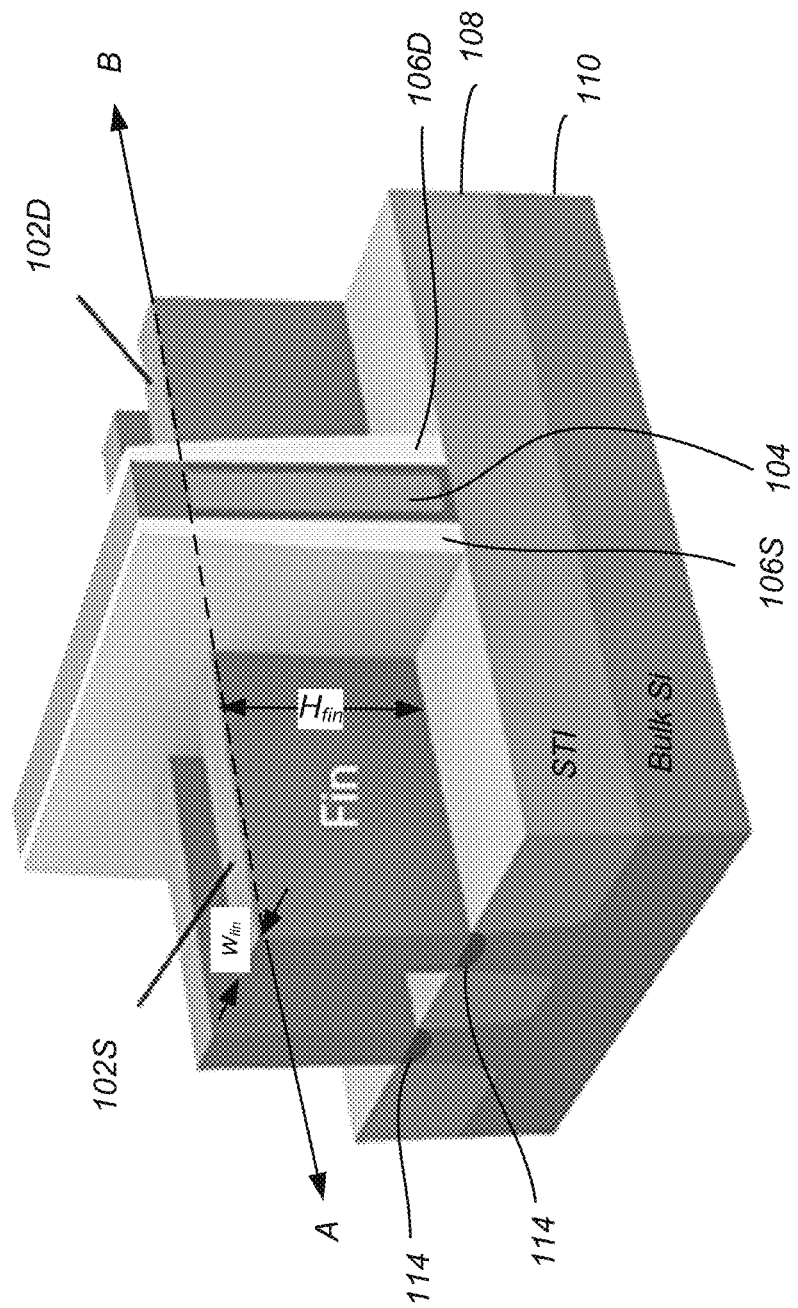
FIG. 1B is a diagram illustrating the basic structure of a standard FinFET transistor in three dimensions.

FIG. 1B is a diagram illustrating the basic structure of a standard FinFET transistor (hereinafter simply FinFET 200) in three dimensions. The FinFET 200 comprises a fin 102 formed on bulk silicon 110. A gate 104 having a source side gate spacer 106S and a drain side gate spacer 106D is disposed over and substantially perpendicular to the fin 102. A shallow trench isolation (STI) layer 108 may also be employed. Punch-through stop (PTS) implants 114 to improve the "off" performance of the FinFET by reducing the leakage current due to punch-through may also be utilized.

The standard bulk FinFET may be produced as follows. Fin material is formed on bulk silicon. One or more fins 102 of height $H_{fin}$ and width $W_{fin}$ is formed on bulk silicon 110, for example, by a lithographic etch. This is followed by a shallow trench isolation (STI) layer to fill the gaps between fins 102, then planarization and oxide recessing to expose the fins 102 as illustrated.

Transistor junctions can then be formed on 3 sides (top, left and right) of the exposed fin 102. Current FinFET technologies no longer form transistor junctions on the top side of the fin 102 due to its complexity and adverse effects. Instead, FinFETs are only built on the left and right sides of the fin 102.

Figure 2A:
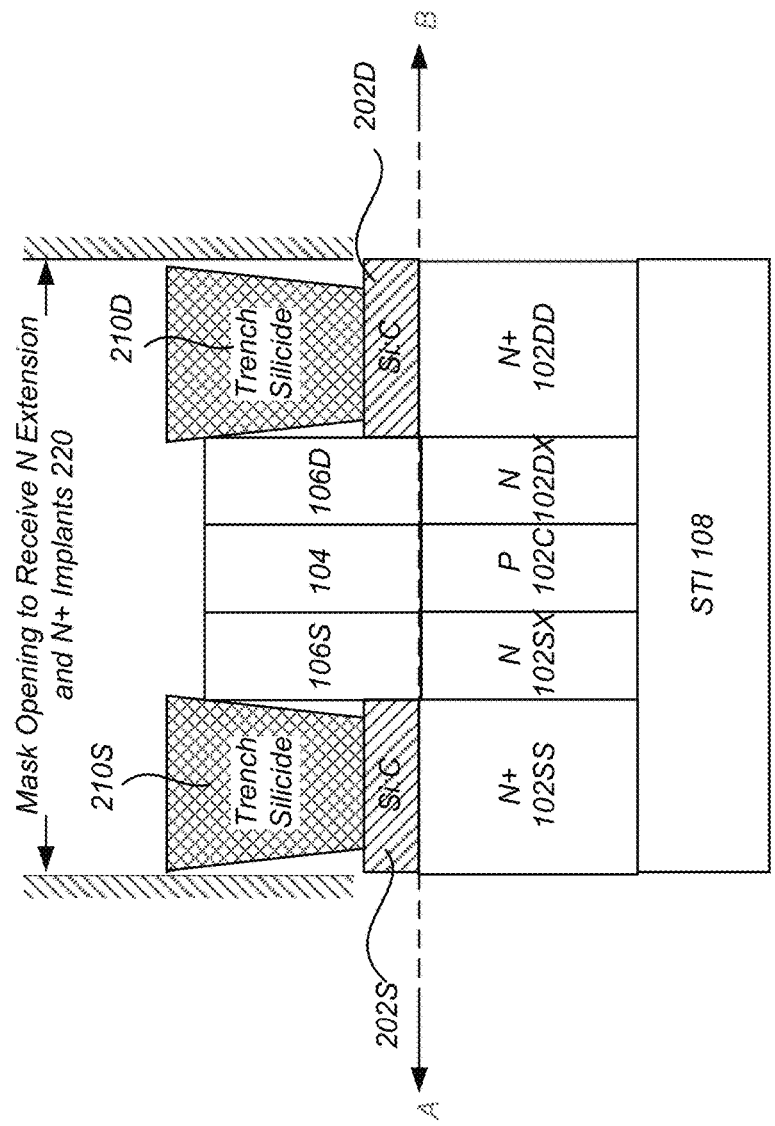
FIG. 2A is a diagram illustrating a cross section of the exposed fin of an N-channel FinFET.
Figure 2B:
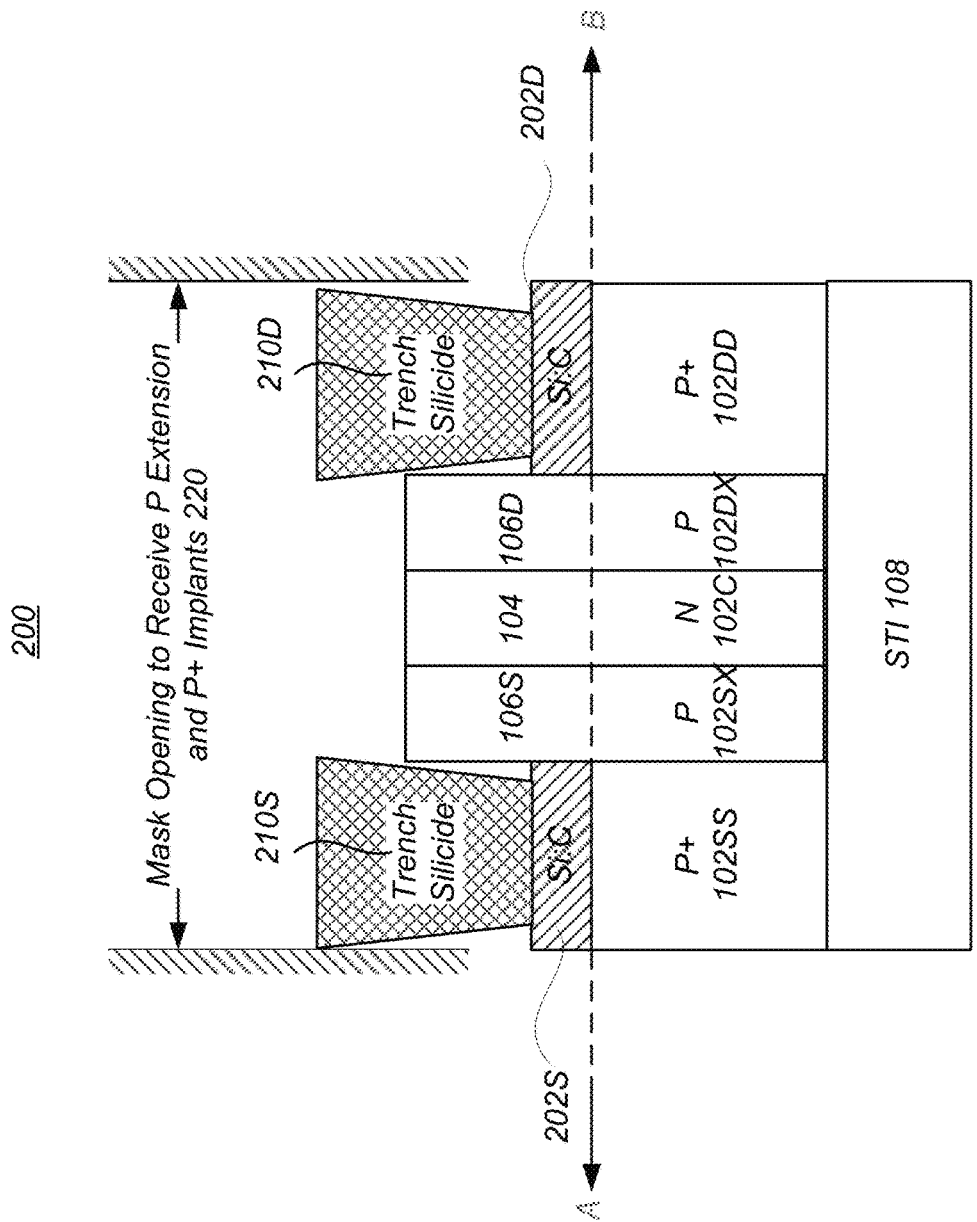
FIG. 2B is a diagram illustrating a cross section of the exposed fin of a P-channel FinFET.

FIGS. 2A and 2B are diagrams illustrating a cross section of the exposed fin 102 of the FinFET. FIG. 2A depicts a side view of an N-type FinFET along axis A-B, and FIG. 2B depicts a side view of a P-type FinFET along the same axis.

Figure 1C:
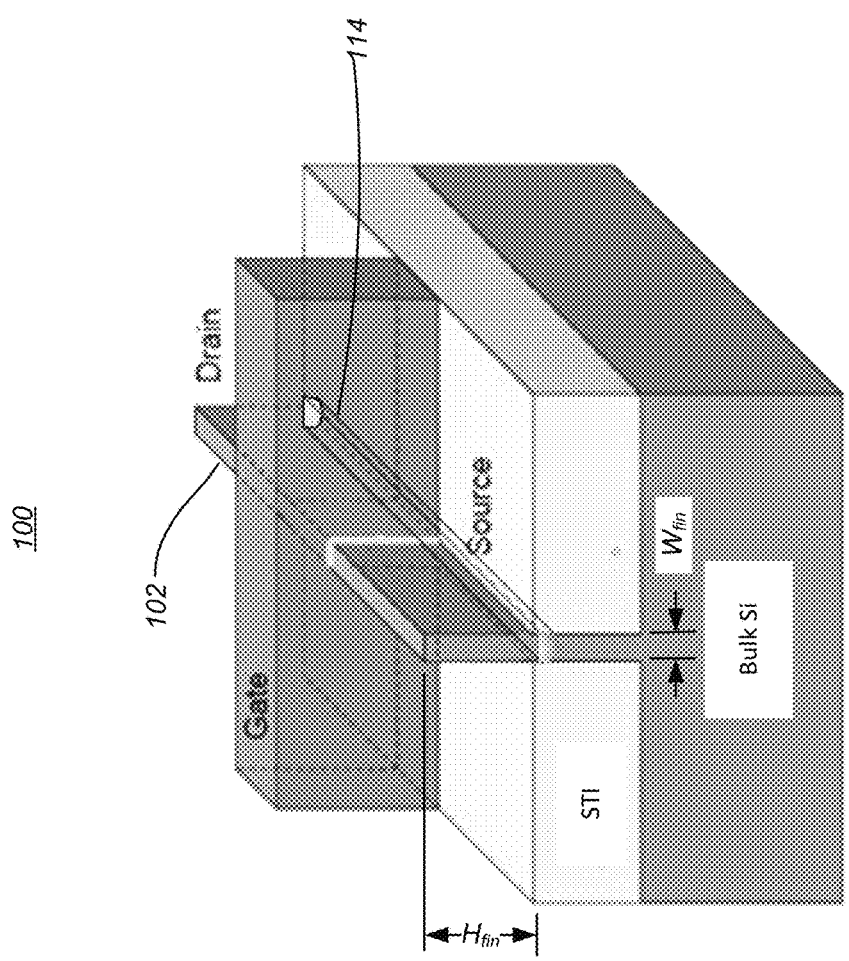
FIG. 1C is the simplified FinFET structure showing the location of the PTS implant.

Well implants are placed to give the correct dopants to the channel region 102C of the fin 102. P well implants are placed in the embodiment depicted in FIG. 2A and N well implants are depicted in the embodiment depicted in FIG. 2B. A punch through stop (PTS) implant may accompany the well implantation. The location of the PTS implants are not shown FIGS. 2A and 2B, as they are behind the STI 108 and not visible in this view. However, their location is analogous to the PTS implants 114 illustrated in FIG. 1B, and is further illustrated in FIG. 1C.

Next, a gate dielectric is grown and a deposition of polysilicon as a dummy gate follows. The dummy gate will be later replaced by a metal gate (104) at the end of the process. After the dummy gate formation, source and drain extension implant is carried out by use of a mask 220 for N-type FinFET in FIG. 2A and mask 220 for P-type FinFET in FIG. 2B having the extent along the A-B axis.

The extension implant covers the source side extension region 102SX and the drain side extension region 102DX. The extension implant also covers the source, source span, drain and drain span regions, but this low dose implant is insignificant in these regions as they will subsequently receive dramatically higher dose implants. This is accomplished for the N channel of the N-type device depicted in FIG. 2A and for the P channel of the P-type device depicted in FIG. 2B. Halo implants may be added at this time together with the extension implant, for further device leakage control.

Next, gate spacers 106S and 106D are formed on both sides of the dummy poly gate (source side gate spacer 106S and drain side gate spacer 106D). The gate spacers 106S and 106D cover the source side extension region 102SX and drain side extension region 102DX, respectively, and the silicon regions under the spacers are protected by the spacers from receiving the N+/P+ implants and that will increase the breakdown voltage and reduce the "short channel effect".

Then, N+ source and drain implant is provided to source region 102SS, and the drain region 102DD to the N-type device of FIG. 2A, with a P+ source and drain implant provided to analogous regions in the P-type device illustrated in FIG. 2B. To enhance carrier mobility of the channels, selective growth of epi-SiGe is implemented on the source region 102SS and drain region 102DD of the N-type device shown in FIG. 2A. Similarly, selective growth of epi-Si:C is implemented on the source region 102SS and drain region 102DD of the P-type device of FIG. 2B.

Self-aligned metal silicide (trench salicide) 202 is then deposited over the source silicon area 102SS and drain silicon area 102DD on the surface of the fin regions 102S and 102D create an epitaxial source region 202S and epitaxial drain region 202D to reduce source and drain resistance and to provide a good electrical connection with the FinFET device. The dummy poly gate is then removed and replaced with a high K dielectric and gate metal. The properties of the high K dielectric material are chosen for proper threshold voltage control of the FinFET.

At this point, the Front-End-Of-Line (FEOL) process to build the FinFET device is finished. Next is the implementation of the Middle-Of-Line (MOL) with self-aligned contacts (SAC) to make connections between FinFETs through the high-level Back-End-Of-Line (BEOL) metallization. For clarity, FIGS. 1A-1B and 2A-2B show only the basic layers without any epi-SiGe or Si:C nor any of the self-aligned contacts in the MOL process.

There are three major connections to be made by the SAC in the MOL process: the contact to the FinFET source region 102SS and drain region 102DD; the contact to the FinFET gate 104; and the last is to provide local interconnect (LI) for short intra-cell routing to allow easier access to the cell I/O pins and relieve the routing congestion burden in on the subsequent Place and Route process. It has become a trend in FinFET technology, with feature sizes typically 16 nm and smaller, that self-aligned contacts (SAC) to source/drain 102SS/102DD and gate 104 are separated into two mask layers in both the design and the lithographic etch process, one layer for source/drain 102SS/102DD contact (CA) and another layer for Gate contact (CB). One reason for the separation is the difference in the depth of the contacts to Source/Drain and the contacts to Gate.

Figure 2C:
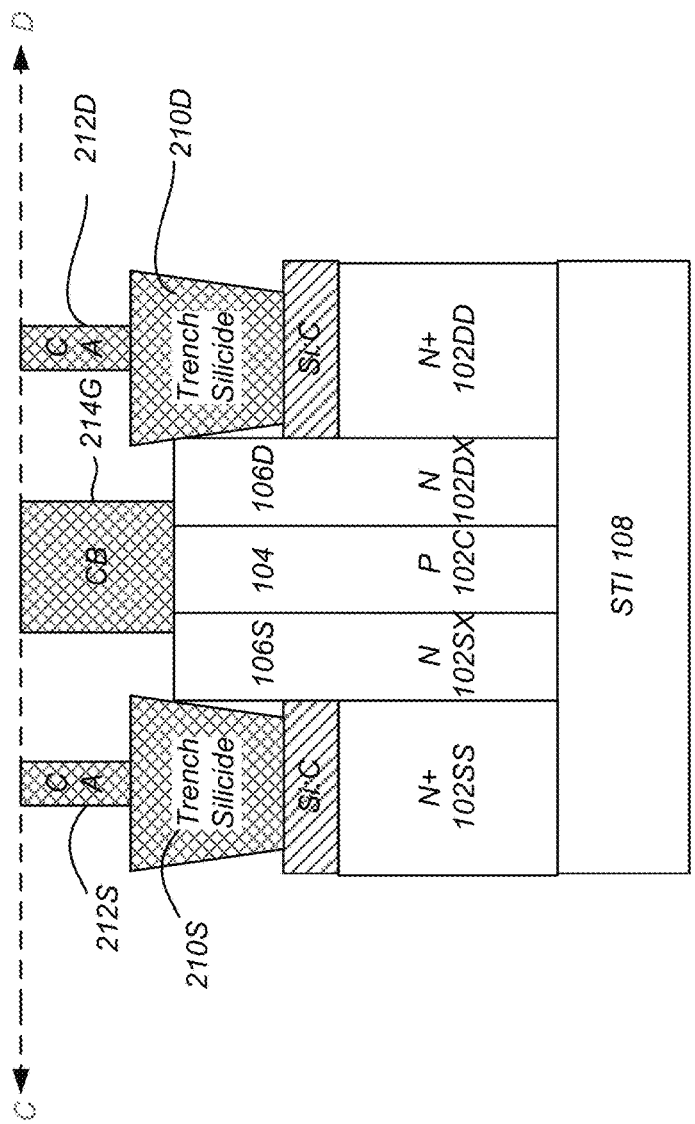
FIG. 2C is a cross section of an N-channel FinFET with contacts.
Figure 2D:
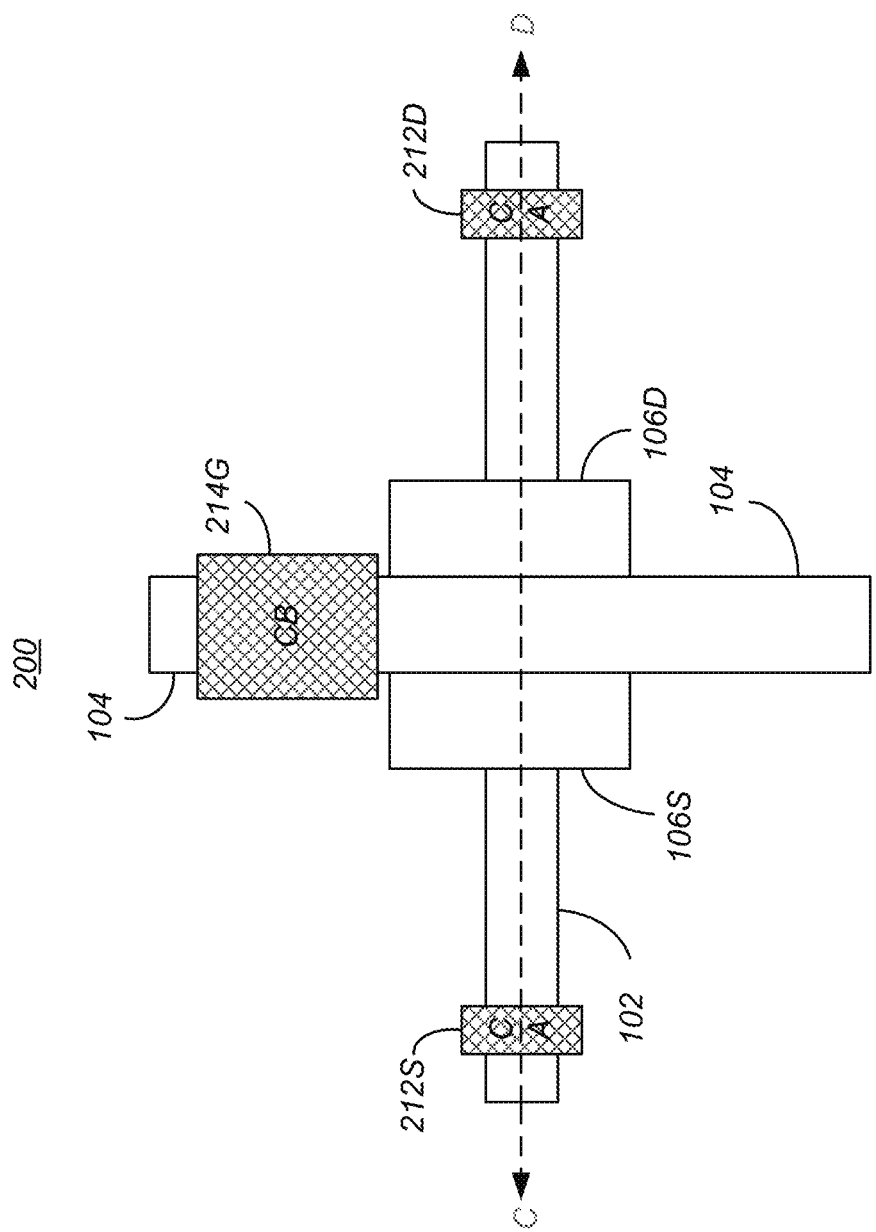
FIG. 2D is a top-down view of the FinFET presented in FIG. 2C.

FIG. 2C is a cross section of a FinFET 200 after the source/drain undergoes epi-SiGe or epi-Si:C, trench silicide growth regions 210S and 210D (at the same time) and the dummy gate replaced by metal gate 104. FIG. 2D is a diagram illustrating a top view of the FinFET 200. Note that the top surface of the trench silicide growth 210S and 210D adjacent the source/drain region with epi-SiGe or epi-Si:C is not at the same level as the surface of the metal gate. If the masking and lithographic etch process for the CA openings 212S and 212D (hereinafter alternatively referred to as CA openings 212 or CA 212) and CB openings 214G are performed at the same time, to etch down to the surface of the metal gate 104 for contacting, over etch of the CA openings 212S and 212D in the source/drain region is inevitable, with the etch into the trench salicide regions 210S and 210D. Such over etch may cause voids and eventually contact resistance reliability problems in the tungsten (W) deposited in CA 212 and CB 214 afterward. Another reason for the separation of the process steps in etching CA openings 212 and CB openings 214 is to allow smaller feature size for both CA openings 212 and CB openings 214 with unidirectional patterning (e.g. extending CA only in vertical direction while CB in horizontal direction) in the ongoing shrinking of the FinFET technologies to smaller sizes such as 10 nm and 7 nm.

In instances where the processes to generate CA openings 212 and CB openings 214 are separate processes, contacts to source and drain (CA openings 212S and 212D) are patterned and etched first with stop at the detection of trench silicide layer 210S and 210D, followed by the lithographic patterning and etching of the CB opening 214G. This is followed by the usual plug process of filling tungsten (W) with Ti/TiN as liner and barrier layers. The CA openings 212 and CB openings 214 are then filled with tungsten at the same time. Ti is the interface layer to form silicide with silicon. The purpose of the barrier material, TiN, is to stop the diffusion of Tungsten into the silicon.

In some FinFET logic cells and custom designs, contact openings CA 212 and CB 214 are purposely made longer and used as short distance intra-cell local interconnects (LI). To extend the use of the local interconnects (LI), a dual damascene process may be added to define a new layer M0 in Tungsten which can be deposited together with the filling of the CA openings 212 and CB openings 214. Although Tungsten has a higher resistivity compared to the copper used in the Back-End-Of-Line (BEOL) metal connections, using LI as a short distance connection in a cell can help to relieve routing congestion near the cells I/O pins and this advantage overrides the adverse resistance effect.

Camouflaged FinFET

The separation of contact openings CA 212 and CB 214 can be used to create a fake contact which is actually an isolation but it looks like a normal contact under optical or scanning electron microscope (SEM). Such a technique is a good candidate in the design of camouflage standard cell library in FinFET technology. In particular, the Middle-Of-Line (MOL) self-aligned contacts (SAC) in FinFET processes can be used to make a fake contact to the gate 104 of the FinFET 200.

As described above, in advanced FinFET logic cells or other circuits, contact to gate 104 is implemented in the CB 214 layer on the top of the gate 104 geometry while the contact to source 102S and drain 102D (S/D) is implemented with the CA 212S and 212D layer over the fin 102 area as depicted in FIG. 2D. Since the contacts to (1) the source 102S and drain 102D and to (2) the gate 104 are separated into two masking layers (CA 212 for source 102S and drain 102D and CB 214 for gate 104), and the surface of the source 102S and drain 102D after trench silicide process (e.g. the top of trench silicide 210S and 210D are not at the same level as the gate 104 metal replacement, a contact hole CA 212G over the gate 104 of the FinFET 200 will not be etched down to touch the gate metal 104. The result is a CA 212 geometry over the FinFET gate 104 that will not make actual electrical contact between the tungsten metal in CA 212 and the FinFET metal gate 104.

Figure 3A:
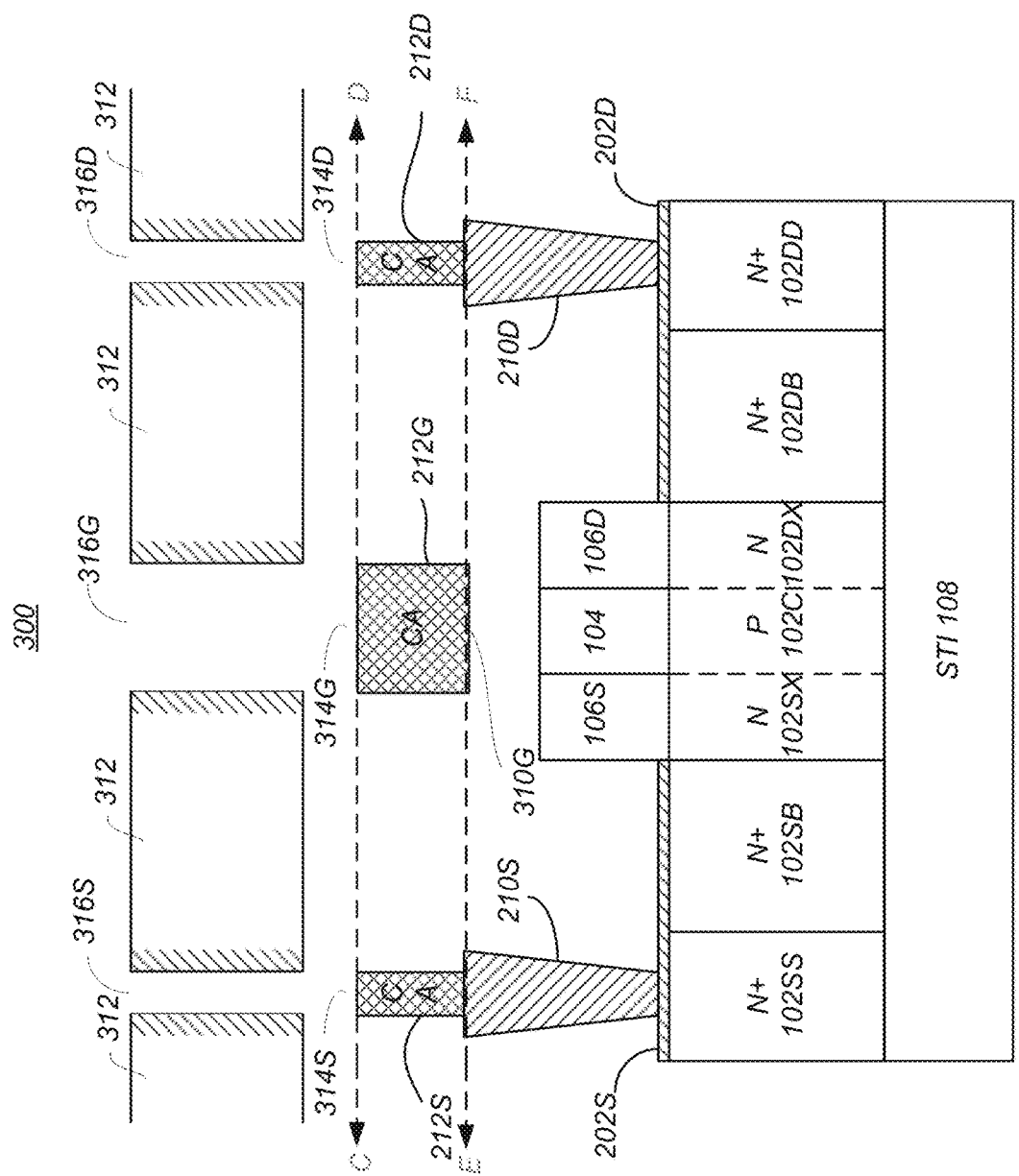
FIG. 3A is a diagram depicting a FinFET camouflaged as described above.

FIG. 3A is a diagram depicting a FinFET 300 camouflaged as described above. In this embodiment, the CB 214G structure on top of the FinFET gate has been changed to a CA structure 212G that extends the dame depth as CA structures 212S and 212D. After the CA 212 pattern etching and fill with tungsten, the tungsten at the bottom of CA openings 212S and 212D are in electrical contact with the source 102S and drain 102D portions of the fin 102, but the tungsten at the bottom of CA opening 212G is still isolated from the gate 104 by the dielectric material remaining therebetween. The CA opening 212G over the gate 104 area does not extend to the gate 104 and hence, does not make contact to the metal gate 104 underneath.

Figure 3B:
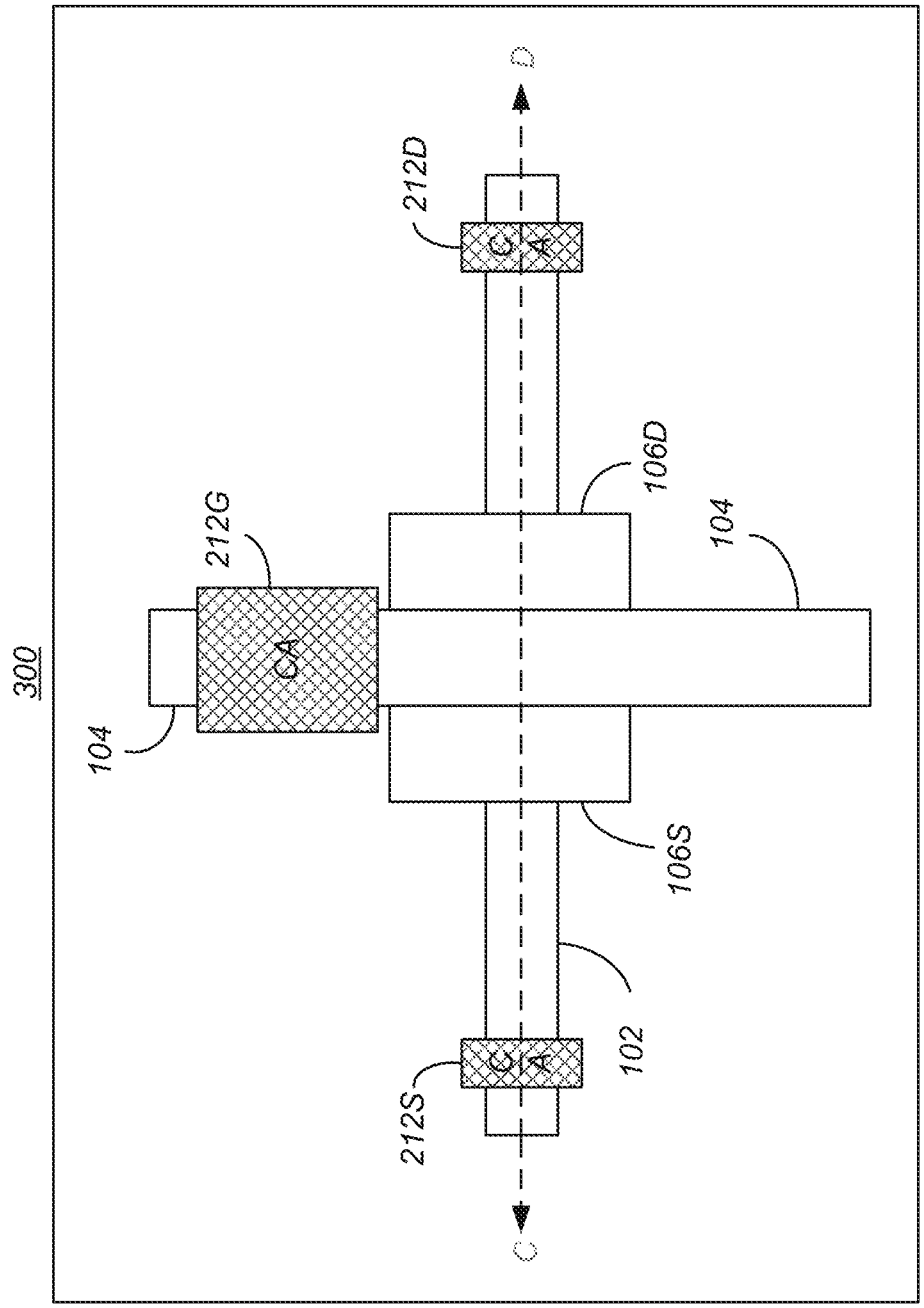
FIG. 3B is a diagram illustrating a top view of the FinFET presented in FIG. 3A.

In physical design, such a change is a straight forward replacement the CB opening 214G geometry with a CA opening 212G geometry of the same appearance (e.g. cross section) when viewed from the top (as shown in FIG. 3B).

FIG. 3B is a diagram illustrating a top view of the FinFET 300 presented in FIG. 3A. Note that the FinFET 300 has the same appearance as the top view of the FinFET 200 depicted in FIG. 2D. In particular, the geometry and dimensions of the CB opening 214G geometry of uncamouflaged FinFET 200 depicted in FIG. 2D is identical to the geometry and dimensions of the CA opening 212G geometry of the camouflaged FinFET 300 depicted in FIG. 3B.

Figure 3C:
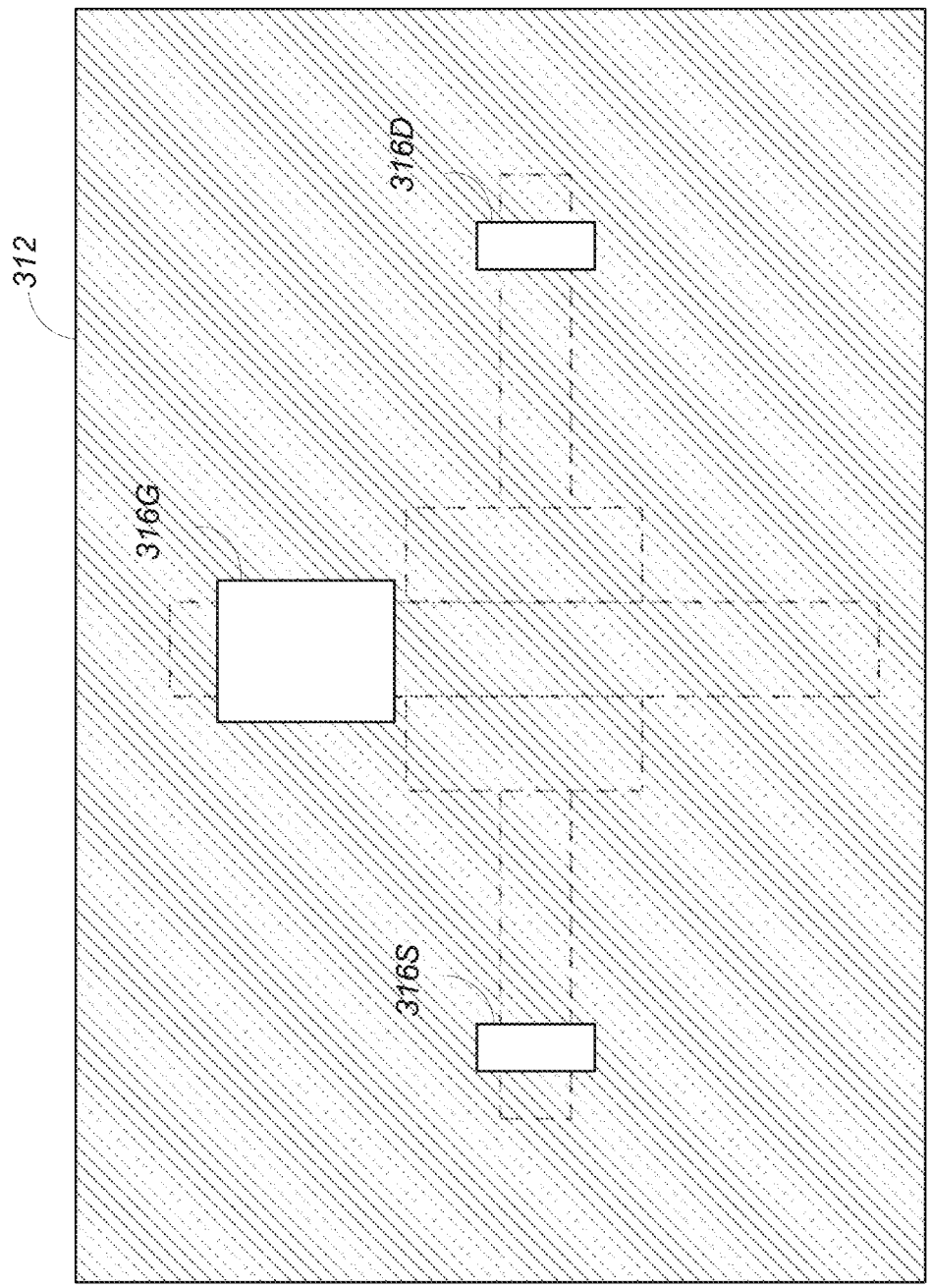
FIG. 3C is a diagram depicting the top view of the FinFET and mask.

FIG. 3C is a diagram illustrating a top view of the mask 312 containing source area opening 316S, drain area opening 316D, and gate area opening 316G to produce CA openings 212S, 212D and openings 214G of FinFET 300 presented in FIG. 3B. In fabrication of the camouflaged FinFET 300 and related circuits, the CA openings 212S, 212D, and 212G and CB openings 214G are filled with tungsten at the same time, and the subsequent CMP (Chemical-Mechanical-Polishing) process will level out the top surface of both the tungsten in the CA openings 212S, 212D and 212G and CB openings 214G. From the top view of the circuit, it is impossible to differentiate the material in the CA openings 212S, 212D, and 212G from the material in the CB openings 214G because they have the same material (tungsten) at the same surface level. In other words, the top image of a contact formed by a CA opening 212G over the gate 104 is identical to images of other contacts formed over actual CB openings 214G of the gates 104 of uncamouflaged FinFETs 200.

A reverse engineering attempt of delayering the circuits down to the contact layers showing CA 212 and CB 214 cannot tell that the CB 214G contact has been replaced by the CA 212G contact. The difference can only be reviewed by a cross section analysis, but it is impossible to analyze every CB 214G contact in the circuit through cross sectioning. Extracting the circuits based on this top image information of CA 212S and 212D and CB 214G (now replaced by CA 212G) by will lead to wrong connection conclusions and an incorrect netlist. This camouflage structure of fake CB 214G contacts is a strong feature in developing camouflage FinFET logic cell libraries.

Figure 4A:
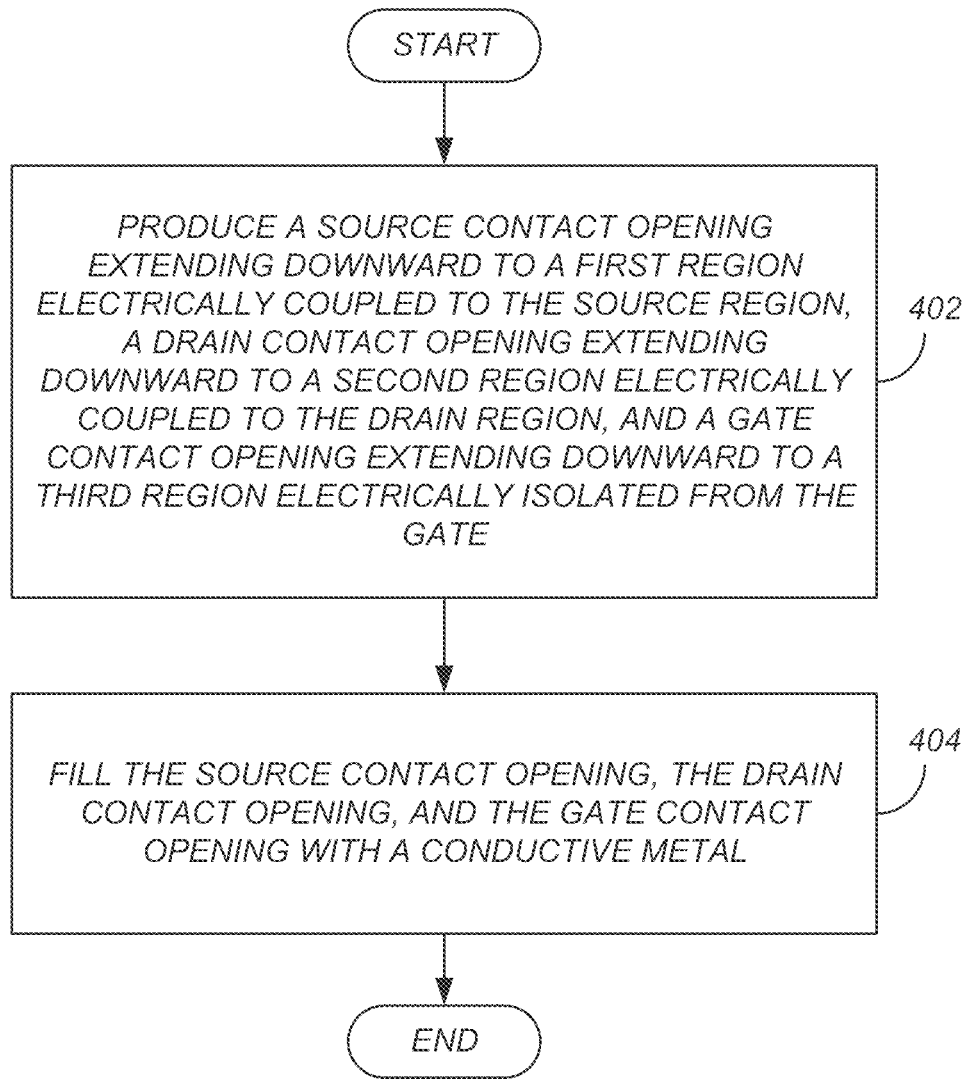
FIGS. 4A and 4B are diagrams illustrating exemplary operations that can be used to produce the camouflaged FinFET.
Figure 4B:
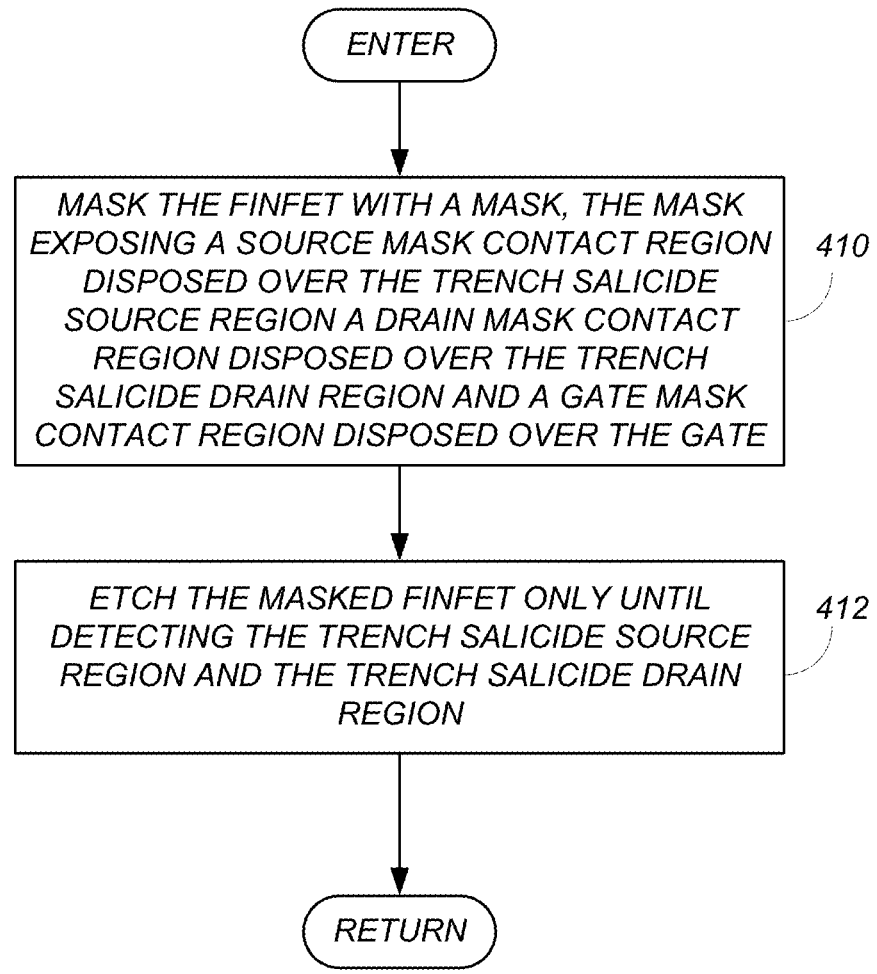

FIGS. 4A and 4B are diagrams illustrating exemplary operations that can be used to produce the camouflaged FinFET 300 by adding a source contact in source contact opening 212S, a drain contact in drain contact opening 212D, and an apparent gate contact in gate contact opening 212G to a FinFET 300 that has a source region 102S, a drain region 102DD and a gate 104 disposed over the fin 102, forming one or more transistor junctions with the fin 102. In block 402, a source contact opening 212S, a drain contact opening 212D, and a gate contact opening 212G are produced. The source contact opening 212S extends downward to a first region such as trench salicide growth region 210S, which is electrically coupled to the source region 102SS. The drain contact opening 212D extends downward to a second region such as trench salicide growth region 210D, which is electrically coupled to the drain region 102DD. The gate contact opening 212G extends downward to a third region 310G electrically isolated from the gate 104. In the illustrated embodiment, the source contact opening 212S, the drain contact opening 212D, and the gate contact opening 212G extend the same depth or distance in the downward direction. Also, the source contact opening 212S, the drain contact opening 212D, and the gate contact opening 212G are typically formed at the same time using the same mask and etch process as further described below.

In one embodiment, this is accomplished by producing a source contact opening 212S extending downward to a top surface of the trench salicide source region 210S, a drain contact opening 212D extending downward to a top surface of the trench salicide drain region 210D, and a gate contact opening 212G extending downward but not extending to a top surface of the gate 104. Note that the upper surface of the gate 104 is disposed below the top surface of the trench salicide source region 210S and the trench salicide drain region 210D. The upper surface of the gate 104 is also disposed above the level of the epitaxial source region 202S (which is disposed between the trench salicide source region 210S and the source region 102SS) as well as above the level of the epitaxial drain region 202D (which is disposed between the trench salicide drain region 210D and the drain region 102DD). The source contact opening 212S, the drain contact opening 212D, and the gate contact opening 212G can be formed by etching the FinFET 300 only down to the (upper surface of) the trench salicide source region 210S and the (upper surface of) the trench salicide drain region 210D. Such etching can be performed by masking the FinFET 300 with a mask 312, the mask having apertures 316S, 316D, and 316G exposing a source mask contact region 314S disposed over the trench salicide source region 210S, a drain mask contact region 314D disposed over trench salicide drain region 210D, and a gate mask contact region 314 disposed over the gate 104. This is shown in block 410 of FIG. 4B.

Then, the masked FinFET 300 is etched only until detecting the trench salicide source region 210S and the trench salicide drain region 210D, as shown in block 412. The gate mask contact region 314G will be etched to the same depth (E-F) as the source mask contact region 314S and the drain mask contact region 314D, but the gate 104 remains electrically isolated due to its greater depth relative to the top of the trench salicide regions 210.

In block 404, the source contact opening 212S, the drain contact opening 212D, and the gate contact opening 212G are filled with a conductive material such as a metal 410410. In one embodiment, the etched FinFET is lined with an interface layer, for example, titanium, and a barrier layer, for example, titanium nitride.

CONCLUSION

This concludes the description of the preferred embodiments of the present disclosure.

The foregoing description of the preferred embodiment has been presented for the purposes of illustration and description. It is not intended to be exhaustive or to limit the disclosure to the precise form disclosed. Many modifications and variations are possible in light of the above teaching. It is intended that the scope of rights be limited not by this detailed description, but rather by the claims appended hereto.

What is claimed is:

1. A method of adding a source contact, a drain contact, and an apparent gate contact to a FinFET having a fin including a source region, a drain region, and a gate disposed over the fin forming one or more transistor junctions with the fin, comprising:
   producing a source contact opening extending downward to a first region electrically coupled to the source region, a drain contact opening extending downward to a second region electrically coupled to the drain region, and a gate contact opening extending downward to a third region electrically isolated from the gate; and
   filling the source contact opening, the drain contact opening, and the gate contact opening with a conductive metal.

2. The method of claim 1, wherein:
   the first region comprises a trench salicide source region; and
   the second region comprises a trench salicide drain region; and
   producing the source contact opening extending downward to a first region electrically coupled to the source region, the drain contact opening extending downward to a second region electrically coupled to the drain region, and the gate contact opening extending downward to a third region electrically isolated from the gate comprises:
   producing the source contact opening extending downward to a top surface of the trench salicide source region, the drain contact opening extending downward to a top surface of the trench salicide drain region, and the gate contact opening extending downward but not extending to a top surface of the gate.

3. The method of claim 2, wherein:
   the FinFET further comprises:
   an epitaxial source region, disposed between the trench salicide source region and the source region, the epitaxial source region electrically coupling the trench salicide source region with the source region;
   an epitaxial drain region, disposed between the trench salicide drain region and the drain region, the epitaxial drain region electrically coupling the trench salicide drain region with the drain region; and
   an upper surface of the gate is disposed at a level below the top surface of the trench salicide source region and the top surface of the trench salicide drain region.

4. The method of claim 3, wherein producing the source contact opening extending downward to the top surface of the trench salicide source region, the drain contact opening extending downward to the top surface of the trench salicide drain region, and the gate contact opening extending downward but not extending to the top surface of the gate comprises:
- etching the FinFET only down to the trench salicide source region and the trench salicide drain region.

5. The method of claim 4, wherein:
- etching the FinFET only down to the trench salicide source region and the trench salicide drain region comprises:
  - masking the FinFET with a mask, the mask exposing:
    - a source mask contact region disposed over the trench salicide source region;
    - a drain mask contact region disposed over the trench salicide drain region; and
    - a gate mask contact region disposed over the gate;
  - etching the masked FinFET only until detecting the trench salicide source region and the trench salicide drain region; and
- the method further comprises:
  - before filling the source contact opening, the drain contact opening, and the gate contact opening with the conductive metal:
    - lining the etched FinFET with an interface layer and a barrier layer.

6. The method of claim 5, wherein:
- the interface layer comprises titanium; and
- the barrier layer comprises titanium nitride.

7. A camouflaged application specific integrated circuit (ASIC), comprising:
- a plurality of interconnected functional logic cells that together perform one or more ASIC logical functions, the plurality of interconnected functional logic cells comprising:
  - at least one camouflaged FinFET, comprising:
    - a fin, having:
      - a source region;
      - a drain region;
    - a gate, substantially perpendicular to the fin, the gate forming one or more transistor junctions with the fin;
    - a source contact disposed in a source contact opening extending downward to a first region electrically coupled to the source region;
    - a drain contact disposed in a drain contact opening extending downward to a second region electrically coupled to the drain region; and
    - a gate contact disposed in a gate contact opening extending downward to a third region electrically isolated from the gate.

8. The ASIC of claim 7, wherein the source contact opening, the drain contact opening, and the gate contact opening extend to a same depth in the ASIC.

9. The ASIC of claim 8, wherein:
- the at least one camouflaged FinFET further comprises:
  - a trench salicide source region;
  - a trench salicide drain region;
- the source contact opening extends downward to a top surface of the trench salicide source region;
- the drain contact opening extends downward to a top surface of the trench salicide drain region; and
- the gate contact opening extending downward but not extending to a top surface of the gate.

10. The ASIC of claim 9, wherein:
- the at least one camouflaged FinFET further comprises:
  - an epitaxial source region, disposed between the trench salicide source region and the source region, the epitaxial source region electrically coupling the trench salicide source region with the source region;
  - an epitaxial drain region, disposed between the trench salicide drain region and the drain region, the epitaxial drain region electrically coupling the trench salicide drain region with the drain region; and
- an upper surface of the gate is below the top surface of the trench salicide source region and the top surface of the trench salicide drain region.

11. The ASIC of claim 9, wherein:
- the source contact opening extending downward to the top surface of the trench salicide source region, the drain contact opening extending downward to the top surface of the trench salicide drain region, and the gate contact opening extending downward but not extending to the top surface of the gate is produced by simultaneously etching the source contact opening, the drain contact opening and the gate contact opening only down to the trench salicide source region and the trench salicide drain region.

12. The ASIC of claim 11, wherein the source contact opening, the drain contact opening, and the gate contact opening are lined with an interface layer and a barrier layer.

13. The ASIC of claim 12, wherein:
- the interface layer comprises titanium; and
- the barrier layer comprises titanium nitride.

14. A FinFET, comprising a fin including a source region, a drain region, and a gate disposed over the fin forming one or more transistor junctions with the fin, the FinFET having a source contact, a drain contact, and an apparent gate contact added by a method of performing operations comprising:
- producing a source contact opening extending downward to a first region electrically coupled to the source region, a drain contact opening extending downward to a second region electrically coupled to the drain region, and a gate contact opening extending downward to a third region electrically isolated from the gate; and
- filling the source contact opening, the drain contact opening, and the gate contact opening with a conductive metal.

15. The FinFET of claim 14, wherein:
- the first region comprises a trench salicide source region; and
- the second region comprises a trench salicide drain region; and
- producing the source contact opening extending downward to a first region electrically coupled to the source region, the drain contact opening extending downward to a second region electrically coupled to the drain region, and the gate contact opening extending downward to a third region electrically isolated from the gate comprises:
  - producing the source contact opening extending downward to a top surface of the trench salicide source region, the drain contact opening extending downward to a top surface of the trench salicide drain region, and the gate contact opening extending downward but not extending to a top surface of the gate.

16. The FinFET of claim 15, wherein:
the FinFET further comprises:
- an epitaxial source region, disposed between the trench salicide source region and the source region, the epitaxial source region electrically coupling the trench salicide source region with the source region; and
- an epitaxial drain region, disposed between the trench salicide drain region and the drain region, the epitaxial drain region electrically coupling the trench salicide drain region with the drain region;

an upper surface of the gate is disposed at a level below the top surface of the trench salicide source region and the top surface of the trench salicide drain region.

17. The FinFET of claim 16, wherein producing the source contact opening extending downward to the top surface of the trench salicide source region, the drain contact opening extending downward to the top surface of the trench salicide drain region, and the gate contact opening extending downward but not extending to a top surface of the gate comprises:
- etching the FinFET only down to the trench salicide source region and the trench salicide drain region.

18. The FinFET of claim 17, wherein:
etching the FinFET only down to the trench salicide source region and the trench salicide drain region comprises:
- masking the FinFET with a mask, the mask exposing:
  - a source mask region disposed over the trench salicide source region;
  - a drain mask region disposed over the trench salicide drain region; and
  - a gate mask region disposed over the gate;
- etching the masked FinFET only until detecting the trench salicide source region and the trench salicide drain region; and the method further comprises:
- before filling the source contact opening, the drain contact opening, and the gate contact opening with the conductive metal:
  - lining the etched FinFET with an interface layer and a barrier layer.

19. The FinFET of claim 18, wherein:
the interface layer comprises titanium; and
the barrier layer comprises titanium nitride.

\* \* \* \* \*